(12) United States Patent
Maligeorgos et al.

(10) Patent No.: US 7,280,001 B2
(45) Date of Patent: Oct. 9, 2007

(54) CAPACITOR ARRAY SEGMENTATION

(75) Inventors: James P. Maligeorgos, Austin, TX (US); Donald A. Kerth, Austin, TX (US); Augusto M. Marques, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 117 days.

(21) Appl. No.: 11/226,041

(22) Filed: Sep. 14, 2005

(65) Prior Publication Data

US 2007/0057739 A1     Mar. 15, 2007

(51) Int. Cl.
*H03B 5/36* (2006.01)

(52) U.S. Cl. .................. 331/158; 331/116 FE; 331/179

(58) Field of Classification Search .......... 331/36 C, 331/117 R, 117 FE, 117 D, 177 R, 179, 116 R, 331/116 FE, 158

See application file for complete search history.

(56) References Cited

U.S. PATENT DOCUMENTS

| | | | |
|---|---|---|---|
| 5,463,285 A | 10/1995 | El-Hamamsy | 315/248 |
| 6,226,506 B1 | 5/2001 | Welland et al. | 455/260 |
| 6,233,441 B1 | 5/2001 | Welland | 455/260 |
| 6,304,152 B1 | 10/2001 | Takahashi | 331/116 |
| 6,311,050 B1 | 10/2001 | Welland et al. | 455/260 |
| 6,327,463 B1 | 12/2001 | Welland | 455/260 |
| 6,549,764 B2 | 4/2003 | Welland | 455/260 |
| 6,574,288 B1 | 6/2003 | Welland et al. | 375/327 |
| 6,760,575 B2 | 7/2004 | Welland | 455/260 |
| 6,836,193 B1 * | 12/2004 | Kim et al. | 331/179 |
| 6,853,272 B1 | 2/2005 | Hughes | 334/15 |
| 2004/0077327 A1 | 4/2004 | Lim et al. | 455/318 |
| 2004/0166815 A1 | 8/2004 | Maligeorgos et al. | 455/73 |

FOREIGN PATENT DOCUMENTS

WO    WO99/60696 A    11/1999

OTHER PUBLICATIONS

U.S. Appl. No. 11/259,888, filed Oct. 27, 2005, entitled "Methods and Apparatus to Generate Small Frequency Changes" by Lawrence Der, Dana Taipale, and Scott Willingham.
U.S. Appl. No. 11/259,910, filed Oct. 27, 2005, entitled "Controlling Fine Frequency Changes In An Oscillator" by Lawrence Der; Dana Taipale; Scott Willingham.
U.S. Appl. No. 11/241,419, filed Sep. 30, 2005, entitled "Cancellation of Undesired Portions of Audio Signals" by Dana Taipale.
PCT/US2006/025691 International Search Report with Written Opinion of the International Searching Authority Mailed Feb. 6, 2007.

* cited by examiner

*Primary Examiner*—David Mis
(74) *Attorney, Agent, or Firm*—Trop, Pruner & Hu, P.C.

(57) ABSTRACT

In one embodiment, the present invention includes a capacitor array that may provide a selected capacitance to a digitally controlled crystal oscillator (DCXO). The array may include multiple sections each having at least one array portion, where each section is to receive different significant portions of a digital control value. The different sections may have different coding schemes. Other embodiments are described and claimed.

26 Claims, 11 Drawing Sheets

CAPACITOR ARRAY SEGMENTATION

FIELD OF THE INVENTION

The invention generally relates to capacitor structures useful in controlling the frequency of an oscillator.

BACKGROUND

A personal wireless communication device (herein called a "wireless device") such as a cellular telephone includes various components, such as modulators, demodulators, frequency synthesizers, etc., that synchronize their operations to a reference clock signal. The reference clock signal may be generated from a sinusoidal reference signal that is provided by an oscillator of the wireless device.

The frequency of the sinusoidal reference signal (and thus, the frequency of the reference clock signal) is not fixed, but rather, a baseband controller of the wireless device may continually "fine tune" the frequency to synchronize communication between the wireless device and a base station. Thus, the wireless device typically controls the frequency of the oscillator in a feedback loop in response to the frequency of an incoming wireless signal from the base station.

FIG. 1 depicts a conventional system 10 that may be used in a wireless device to control the oscillation frequency of a crystal oscillator 24. The oscillator 24 provides a sinusoidal reference signal (at its output terminal 26) that is converted by other circuitry (not shown) into a reference clock signal for the wireless device. The system 10 includes a baseband control circuit 12 that receives an indication of the frequency of the incoming wireless signal and generates an analog signal (called "AFC") in an attempt to match the oscillation frequency of the oscillator 24 to the incoming frequency. The frequency of the incoming wireless signal may be determined, for example, by examining a particular time segment of the incoming wireless signal.

Based on the determined frequency of the incoming wireless signal, the baseband control circuit 12 typically generates digital data that indicates a frequency for the oscillator 24 (and thus, the frequency for the reference clock signal). A digital-to-analog converter (DAC) 14 of the wireless device produces the AFC analog signal in response to the digital data. The AFC signal propagates through a low pass filter 18 before reaching a varactor 22, a component that is coupled to the oscillator 24 to control the oscillator's frequency (and thus control the frequency of the reference clock signal).

The varactor 22 has a capacitance that is controlled by its DC reverse-bias operating point. Therefore, the AFC analog signal controls the DC reverse-bias and capacitance of the varactor 22. Because the varactor 22 is coupled to a resonant tank (not shown in FIG. 1) of the oscillator 24, the capacitance of the varactor 22 controls the oscillation frequency of the oscillator 24 and thus, controls the frequency of the reference clock signal. Analog control, however, may be undesirable in certain implementations due to size, power, and noise or interference considerations. Accordingly, other ways of controlling an oscillator's frequency are needed.

SUMMARY OF THE INVENTION

In one aspect, the present invention resides in a capacitor array that may provide a selected capacitance to a digitally controlled crystal oscillator (DCXO). The array may include a first section having at least one first array portion to receive a first significant portion of a digital control value, and a second section having at least one second array portion to receive a second significant portion of the digital control value. Each of the first and second sections may have different coding schemes. In some embodiments, the array may further include a third section having at least one third array portion to receive a third significant portion of the digital control value. Such a third section may have a third coding scheme.

Another aspect of the present invention may reside in a method for controlling different portions of a capacitor array according to different coding schemes, where each portion is controlled by different portions of a control word. As examples, the coding schemes may be different thermometer coding or radix coding schemes. Still further, one or more portions may be controlled according to another weighting scheme such as a binary weighting. Further, to enable monotonic changes between different portions of the array, a one or more tuning portions may be used to provide impedance scaling between different portions.

In yet another aspect, an array bank may include a plurality of first array elements each having a plurality of first unit capacitances of substantially equal value. A first portion of these elements may be digitally controlled according to a first plurality of bits and a second portion may be digitally controlled according to a second plurality of bits. A least significant bit of the first plurality of bits may control the first unit capacitances of at least one first array element, while a least significant bit of the second plurality of bits may control a single first unit capacitance of a single first array element.

Some embodiments may be in the form of a system, such as a wireless system, that includes a baseband processor and a transceiver that includes a DCXO to generate a reference signal based on an array according to an embodiment of the present invention. In such manner, the DCXO may be controlled to effect fine frequency changes via implementation of monotonic capacitance changes between different portions of the array. Embodiments of the present invention may be implemented in appropriate hardware, firmware, and software. To that end, one embodiment may be implemented in a system for wireless transmission. Still other embodiments may include a system including an integrated circuit such as a transceiver along with additional components.

DETAILED DESCRIPTION

In various embodiments, a segmented capacitor array bank may be used to provide a selected level of capacitance into a resonant tank of an oscillator. In such manner, high-resolution capacitance switching may be provided for use by the resonant tank. Using a segmented capacitor array in accordance with an embodiment of the present invention, a finely tunable capacitor bank may be provided that enables fine frequency tuning of an associated digitally controlled crystal oscillator (DCXO). In different embodiments, different manners of segmenting a capacitor array may be realized. For example, different weighting strategies may be applied to different segments of the capacitor bank to effect desired capacitance levels, enabling fine capacitance changes, in turn enabling fine frequency changes. Further, the capacitor array may be digitally controlled (i.e., a digitally controlled capacitor array (DCCA)). The capacitor array may also be referred to as a capacitive digital-to-analog converter (CDAC).

To generate a desired frequency, one or more tuning steps may be performed based upon a control signal, e.g., a control word. For example, there may be a coarse tuning section and one or more finer tuning sections, such as a medium tuning section and a fine tuning section. In generating a desired frequency, first the coarse tuning section may be tuned to generate a rough approximation of the desired frequency. Then the medium and fine tuning sections may be tuned to more accurately generate the desired frequency.

Figure 2:
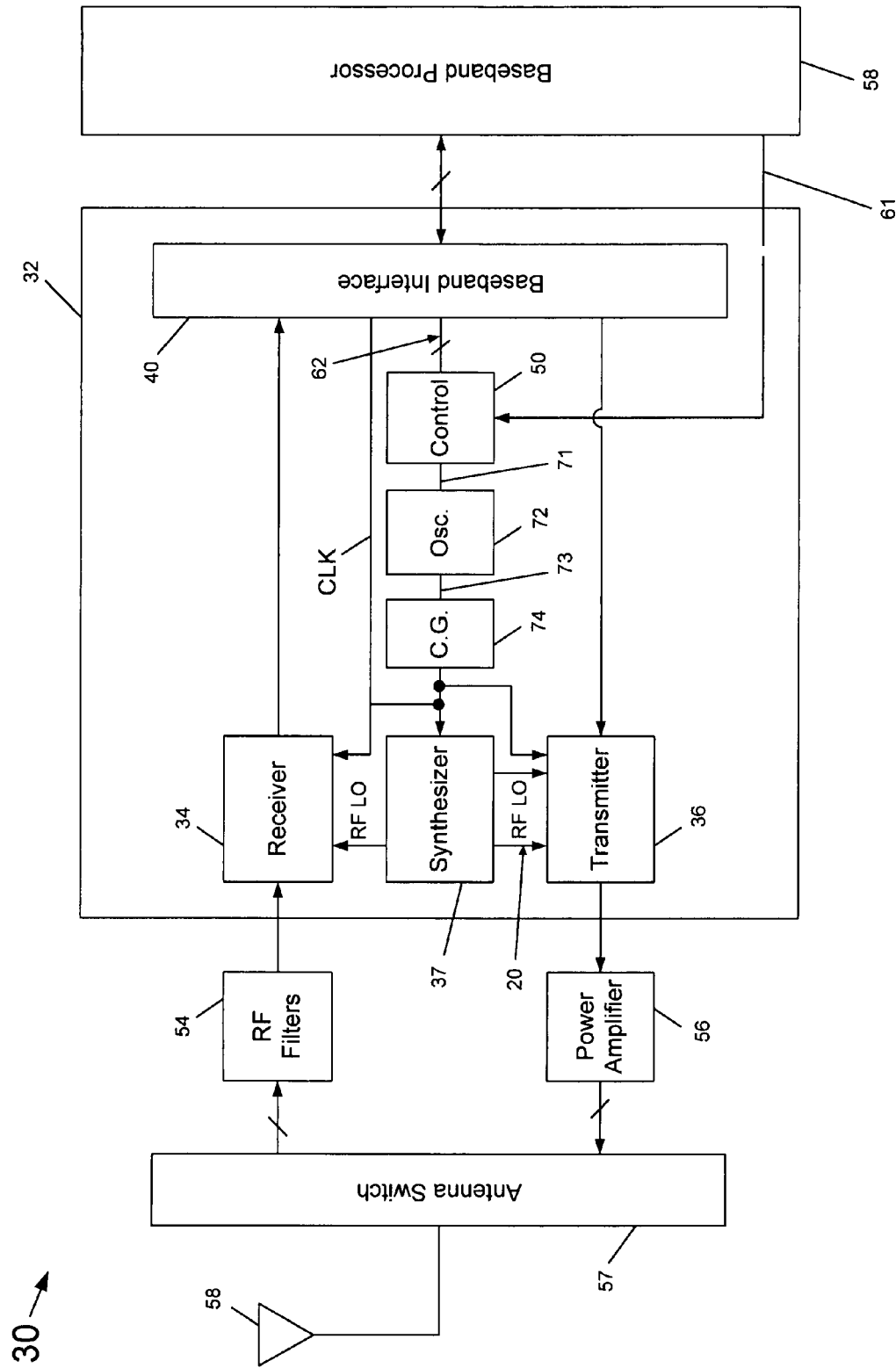
FIG. 2 is a block diagram of a wireless transceiver in accordance with an embodiment of the invention.

Referring to FIG. 2, in accordance with an embodiment of the invention, a wireless transceiver 32 (of a wireless system 30) includes an on-chip reference oscillator 72 that is constructed to be digitally tuned. More particularly, the oscillator 72 is constructed to selectively couple impedances (capacitances, for example) to its resonant tank in response to a digital frequency control signal 71 (multi-bit digital data, for example). This digital control, in turn, may be used to both coarsely tune (tune to within 1.0 parts per million (ppm), for example) and finely tune (tune to less than 0.01 ppm, for example) the fundamental frequency of oscillation (herein called the "oscillation frequency") of the oscillator 72. As an example, in an implementation for a global system for mobile communication (GSM) transceiver the digital control may, at its least significant bit, provide a step change of less than 0.01 ppm.

The oscillator 72 oscillates at the oscillation frequency to produce a reference sinusoidal signal at its output terminal 73. A clock generator 74 of the transceiver 32 produces a reference clock signal (called "CLK") in response to the reference sinusoidal signal, and the CLK clock signal is used internally in the transceiver 32 to synchronize various operations of the transceiver 32.

The wireless system 30, in some embodiments of the invention, may be a personal wireless communication device (called a "wireless device" herein), such as a cellular telephone or personal digital assistant (PDA) with wireless capabilities, as examples. The wireless system 30 and other wireless and non-wireless systems that incorporate the circuits and/or techniques that are disclosed herein are within the scope of the appended claims.

The transceiver 32, in some embodiments of the invention, has both analog and digital frequency control interfaces, either of which may be used by circuitry that is external to the transceiver 32 to fine tune the oscillation frequency. More specifically, in some embodiments of the invention, the transceiver 32 in its entirety may be fabricated on one or more semiconductor dies that are part of a single semiconductor package. In these embodiments of the invention, one or both of the analog and digital frequency control interfaces may include one or more external pins of this semiconductor package. Thus, one or more of the external pins of the semiconductor package may form one or more input terminals of the analog frequency control interface; and one or more of the external pins of the semiconductor package may form one or more input terminals of the digital frequency control interface.

Figure 1:
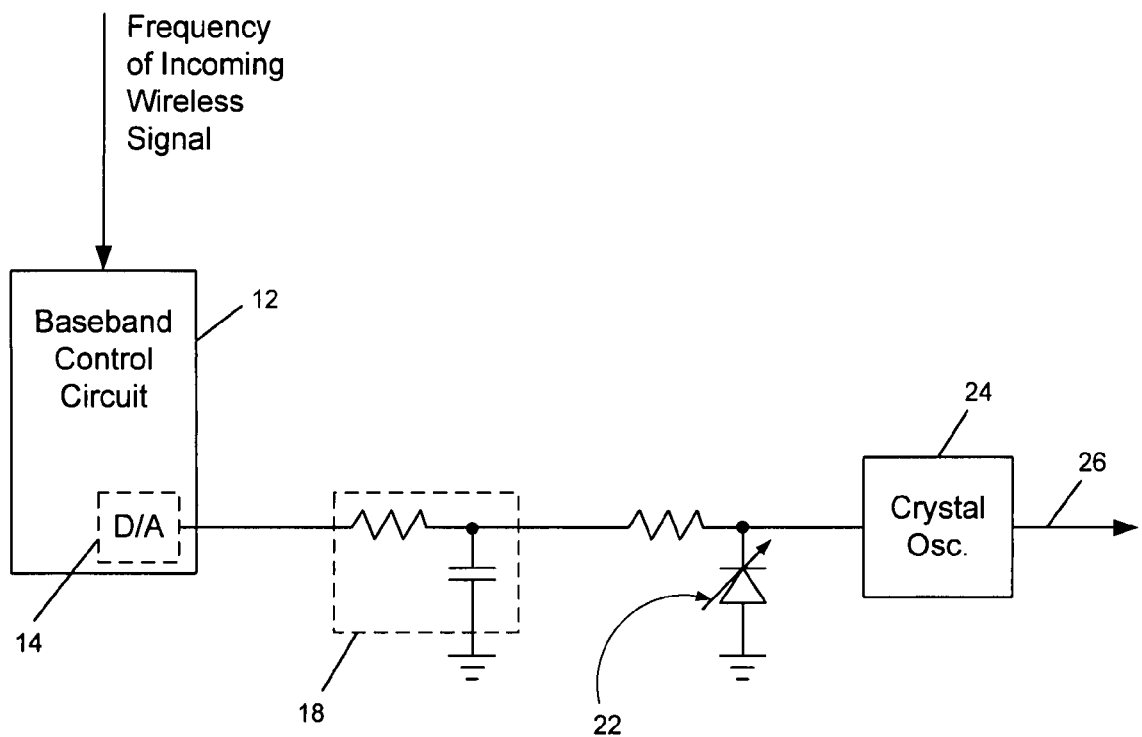
FIG. 1 is a block diagram of a conventional system for controlling the oscillation frequency of a crystal oscillator.

Although one solution for digitally controlling the fine tuning of the oscillator 72 may include moving a DAC, such as the DAC 14 (see FIG. 1), from a baseband control circuit (such as the baseband control circuit 12 of FIG. 1) to the transceiver, such a control may not address the potential scenario in which a baseband control circuit provides an analog signal to the transceiver for purposes of controlling the oscillation frequency. Therefore, referring to FIG. 2, the transceiver 32, in accordance with some embodiments of the invention, includes a frequency control circuit 50 that includes both the above-mentioned analog and digital frequency control interfaces for controlling the oscillation frequency.

Figure 3:
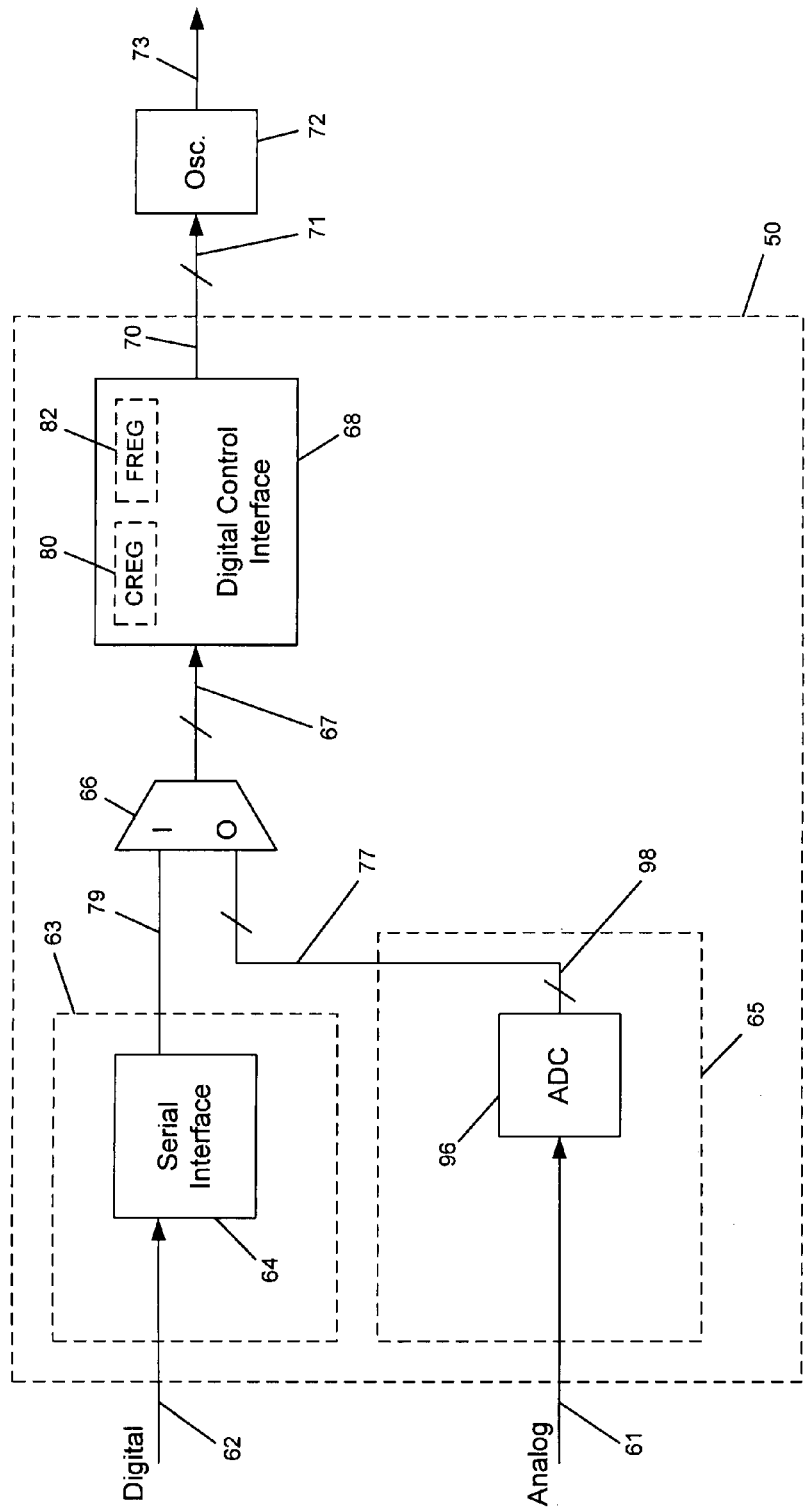
FIG. 3 is a block diagram of a circuit including a first digital interface in accordance with an embodiment of the invention

Referring to FIG. 3, more specifically, in some embodiments of the invention, the circuit 50 includes a first digital interface 63 for purposes of receiving a digital signal to digitally control an oscillation frequency of the oscillator 72 and a second analog input interface 65 for purposes of controlling the oscillation frequency via an analog input signal.

The digital interface 63 includes digital input lines 62 that may be, for example, input lines that are coupled to a serial bus (of the wireless system 30) that, in turn, is coupled to a baseband subsystem 58 that is separate from the transceiver 32. The digital input lines 62 may be coupled to external pins of a semiconductor package that contains the transceiver 32. A serial port interface 64 of the circuit 50 receives the digital signal over the lines 62 and provides output lines 79 from the interface 63. In one embodiment, the digital interface 63 may be in accordance with the DigRF Baseband/RF Digital Interface Specification.

When digital control of the oscillation frequency is desired, a multiplexer 66 of the circuit 50 selects the output lines 79 of the serial port interface 64 and provides the digital signal from the interface 64 to input lines 67 of a digital control circuit 68. In one implementation, the digital control circuit 68, in turn, stores the digital signal in either a fine tuning register 82 or a coarse tuning register 80 of the circuit 68, as further described below. The fine tuning and coarse tuning registers 80 and 82 may be individually addressable by circuitry (such as the baseband control subsystem 58) that is external to the transceiver 32, in some embodiments of the invention.

The digital control circuit 68 may process (as described further below) the values that are stored in the registers 80 and 82 to produce another digital signal (called the "digital frequency control signal 71" herein). The digital frequency control signal 71 is communicated (via communication lines 70) to one or more DCCA's in accordance with one embodiment to control an amount of capacitance provided to a resonant tank of the oscillator 72 to set its oscillation frequency in response thereto.

The transceiver 32 may be used with circuitry that alternatively provides an analog signal (instead of a digital signal), such as the baseband control subsystem 58, that alternatively provides an analog signal (instead of a digital signal) for purposes of controlling the oscillation frequency. More specifically, to accommodate such circuitry, the analog input interface 65 includes an analog control input line 61 that is designed to receive an analog frequency control signal that indicates the oscillation frequency. The input line 61, in turn, is coupled to an input terminal of an analog-to-digital converter (ADC) 96 (a continuous-time delta sigma converter, for example).

The ADC 96 converts the voltage appearing on the analog control input line 61 into a digital signal that appears on output terminals 98 of the ADC 96. When analog control of the oscillation frequency is desired, the multiplexer 66 selects the output lines 98 and thus, couples the input lines 77 of the multiplexer 66 to input lines 67 of the digital control circuit 68. In response to the digital signal from the ADC 96, the digital control circuit 68 stores the digital signal in the appropriate register 80 and 82, potentially processes the signal further (as described below) and then provides the corresponding digital frequency control signal 71 to the one or more DCCA's.

Thus, the transceiver 32 has a digital input mode in which the digital interface 63 is used to control the oscillation frequency of the oscillator 72 and an alternative analog input mode in which the analog interface 65 is used to control the oscillation frequency.

In some embodiments of the invention, the transceiver 32 may be incorporated into a wireless system, such as the exemplary wireless system 30 that is depicted in FIG. 2. Referring back to FIG. 2, as part of this system 30, the transceiver 32 may include a receiver 34 and a transmitter 36. The receiver 34 may be a heterodyne or a homodyne receiver, depending on the particular embodiment of the invention. A heterodyne receiver may include a low intermediate frequency (IF) architecture. In some embodiments of the invention, the transmitter 36 may be a direct up or a heterodyne transmitter. For embodiments of the invention in which the transmitter 36 is a heterodyne transmitter, the heterodyne transmitter may incorporate an offset phase locked loop (PLL) architecture.

As depicted in FIG. 2, in some embodiments of the invention, a synthesizer 37 of the transceiver 32 may provide a radio frequency (RF) local oscillator signal to the receiver 34; and furthermore, the synthesizer 37 may provide both an RF local oscillator signal and an IF local oscillator signal to the transmitter 36. Depending on the particular embodiment of the invention, the synthesizer 37 may incorporate an RF PLL or an IF PLL or a combination of both of these components. The main function of the synthesizer 37 is to provide local oscillator signals to the receiver 34 and the transmitter 36. These local oscillator signals, in turn, are generated by the synthesizer 37 in response to the CLK reference clock signal that is provided by the clock generator 74.

As depicted in FIG. 2, in some embodiments of the invention, the CLK reference clock signal may also be provided (in addition to the synthesizer 37) to the receiver 34, the transmitter 36 and a baseband interface 40. Collectively, the clock generator 74, oscillator 72 and control circuit 50 may be referred to as the reference block.

As its name implies, the baseband interface 40 forms an interface for the transceiver 32 to an external baseband processor 58, in some embodiments of the invention. The baseband interface 40 may be a digital interface, an analog interface or a combination of a digital and an analog interface, depending on the particular embodiment of the invention. Among its other features, in some embodiments of the invention, the wireless system 30 may include power amplifiers 56 for purposes of amplifying the RF signals to be provided to an antenna 58 and RF filters 54 for purposes of filtering an RF signal received from the antenna 58. Furthermore, the wireless system 30 may include an antenna switch 57 that is coupled between the RF filters 54 and the power amplifier 56.

In some embodiments of the invention, the baseband processor 58 may be coupled to or form part of an application subsystem that may include various input devices, such as a keyboard and an output device for purposes of forming an interface with a user of the wireless system 30. Furthermore, in some embodiments of the invention, this application subsystem may execute various application programs for purposes of interfacing with a user of the wireless system 30. The wireless system 30, as well as the transceiver 32, illustrate only a few out of the many possible embodiments of circuitry that may employ the oscillation frequency control techniques and interfaces that are disclosed herein.

Figure 4:
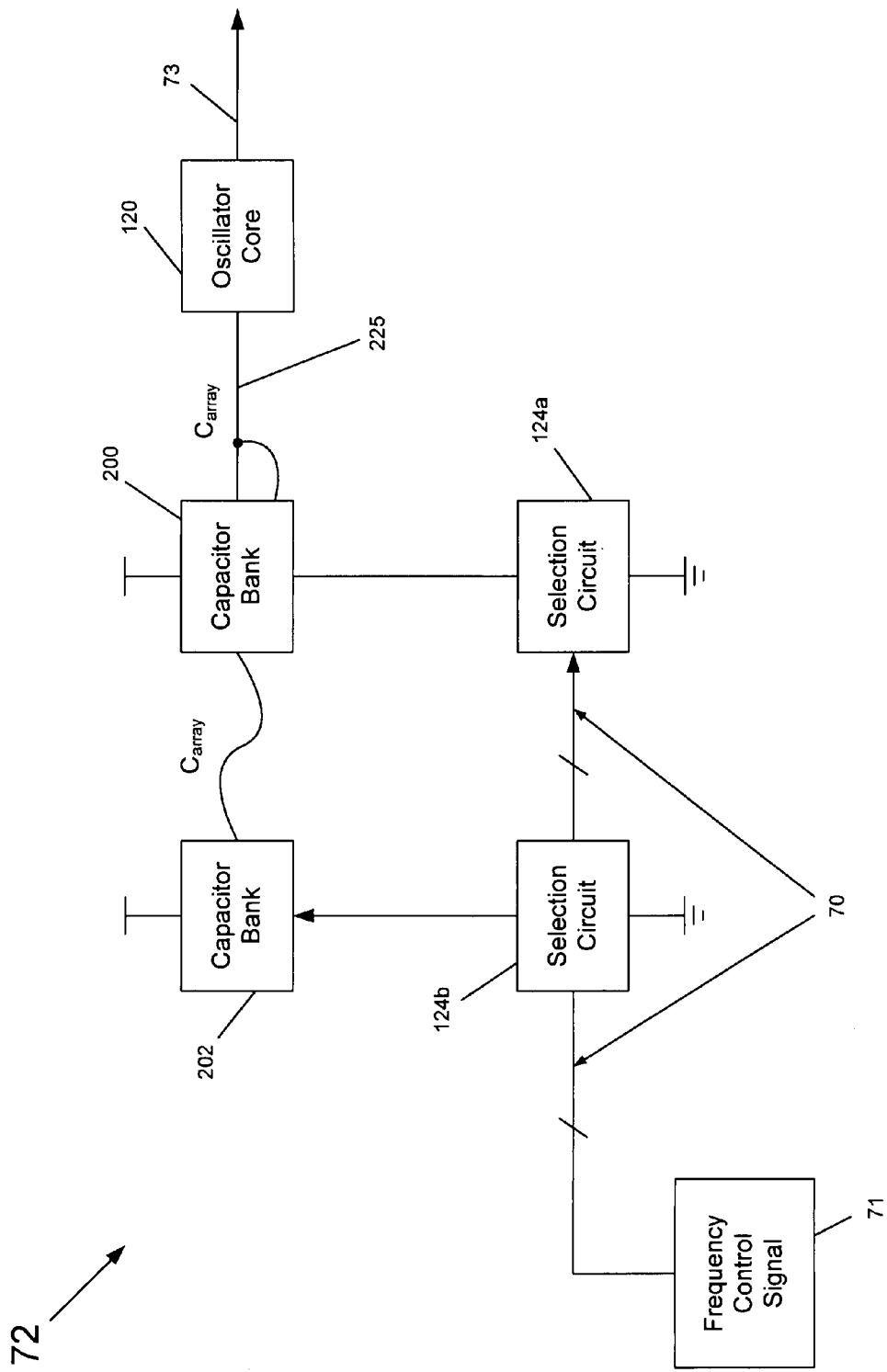
FIG. 4 is a block diagram of a capacitor array in accordance with one embodiment of the present invention.

In some embodiments of the invention, the tuning of the oscillator's frequency is controlled by a bank of capacitors that are selectively coupled to and isolated from a resonant tank of the oscillator 72 in response to the digital frequency control signal 71. More specifically, referring to FIG. 4, shown is a block diagram of an oscillator in accordance with one embodiment. As shown in FIG. 4, in some embodiments of the invention, the oscillator 72 includes a first capacitor bank 202 and a second capacitor bank 200 (i.e., DCCA's) that are coupled by a capacitor array line 225 to an oscillator core 120. The capacitance that appears on the line (i.e., $C_{array}$) 225 controls the oscillation frequency of the oscillator core and therefore, controls the oscillation frequency of the reference sinusoidal signal that appears on an output terminal 73 of the oscillator core 120 (and oscillator 72). As further shown in FIG. 4, the capacitor arrays 200 and 202 may be controlled via a respective one of selection circuits 124a and 124b (generically selection circuits 124), which are coupled to receive respective portions of the digital frequency control signal 71 via a line 70. Thus, for purposes of controlling the level of capacitance that appears on the line 225, the oscillator 72 includes selection circuits 124a and 124b that selectively activate or deactivate individual capacitor elements of banks 200 and 202 to effectively increase or decrease the total effective capacitance on the line 225. The selection circuits 124a and 124b may be adapted to implement various coding schemes. One terminal of each capacitor of the banks 200 and 202 is coupled to the line 225 which is coupled to the resonant tank and thereby alters the frequency of the oscillator 72. In response to the digital frequency control signal 71, the selection circuits selectively couple the capacitors of the banks 200 and 202 to ground so that when a particular capacitor of the banks 200 and 202 is coupled to ground, the capacitor becomes coupled to the resonant tank and contributes to the capacitance of the line 225. Otherwise, the capacitor remains isolated from the resonant tank and does not contribute to the capacitance of the line 225.

The selection of which capacitors of the banks 200 and 202 are coupled to ground (and thus coupled onto the array line 225) is made in response to the frequency control signal 71. The frequency control signal 71 is a multi-bit digital signal (one or more words of data, for example), in some embodiments of the invention, which indicates the oscillation frequency. For example, in some embodiments of the invention, some of the most significant bits (MSBs) of the frequency control signal 71 may be associated with a value that is stored in the coarse frequency control register 80 (FIG. 3) and thus, establish the coarsely-tuned frequency of the oscillator 72. Therefore, these MSBs establish the frequency of the oscillator 72 to about one part per million (ppm), in some embodiments of the invention. In the embodiment of FIG. 4, the first bank 202 may be controlled by the value in coarse frequency control register 80 via the selection circuit 124b. This coarse value may be 7 bits, in one embodiment, and may control a capacitance of twice that of the second bank 200.

In contrast, the less significant bits of the frequency control signal 71 may be associated with the fine tuning of the frequency of oscillation. In this regard, these bits may be associated with fine tuning the oscillation frequency to about 0.1 or even 0.01 ppm, depending on the particular embodiment of the invention. While many implementations are possible, in an embodiment for a GSM transceiver the value of the digital frequency control signal 71 stored in the fine tuning register 82 may be a 13-bit digital word to accommodate the full dynamic range for GSM communication. This fine value portion may control capacitor bank 200, for example, via the selection circuit 124a. In some implementations, both capacitor banks 200 and 202 may be similarly formed. The selection circuits 124 may take on various forms, depending on the particular embodiment of the invention. For example, at least one of the selection circuits 124 may include decode logic, e.g., thermometer decode logic that in response to at least part of the digital frequency control signal 71 generates select signals to selectively control the activation of switches within the capacitor banks 200 and 202.

In some embodiments of the invention, the coarse setting of the oscillation frequency (and thus the setting of the first capacitor bank 202) is a one-time event. For example, the coarse frequency register 80 may be programmed at the initialization (at power up, for example) of the transceiver 32. Alternatively, the value may be permanently programmed into the register 80 by the manufacturer of the wireless system 30.

During the course of operation of the transceiver 32, however, the frequency of operation of the oscillator 72 continually changes (due to temperature drift for instance) (and thus the second capacitor bank 200 is continually adjusted) in a feedback loop due to updates (e.g., via writes to the fine tuning register 82) to the frequency control signal 71. It is noted that this ongoing feedback loop synchronizes the frequency of the reference clock signal to the frequency of the wireless signal that is received from the base station.

Figure 5A:
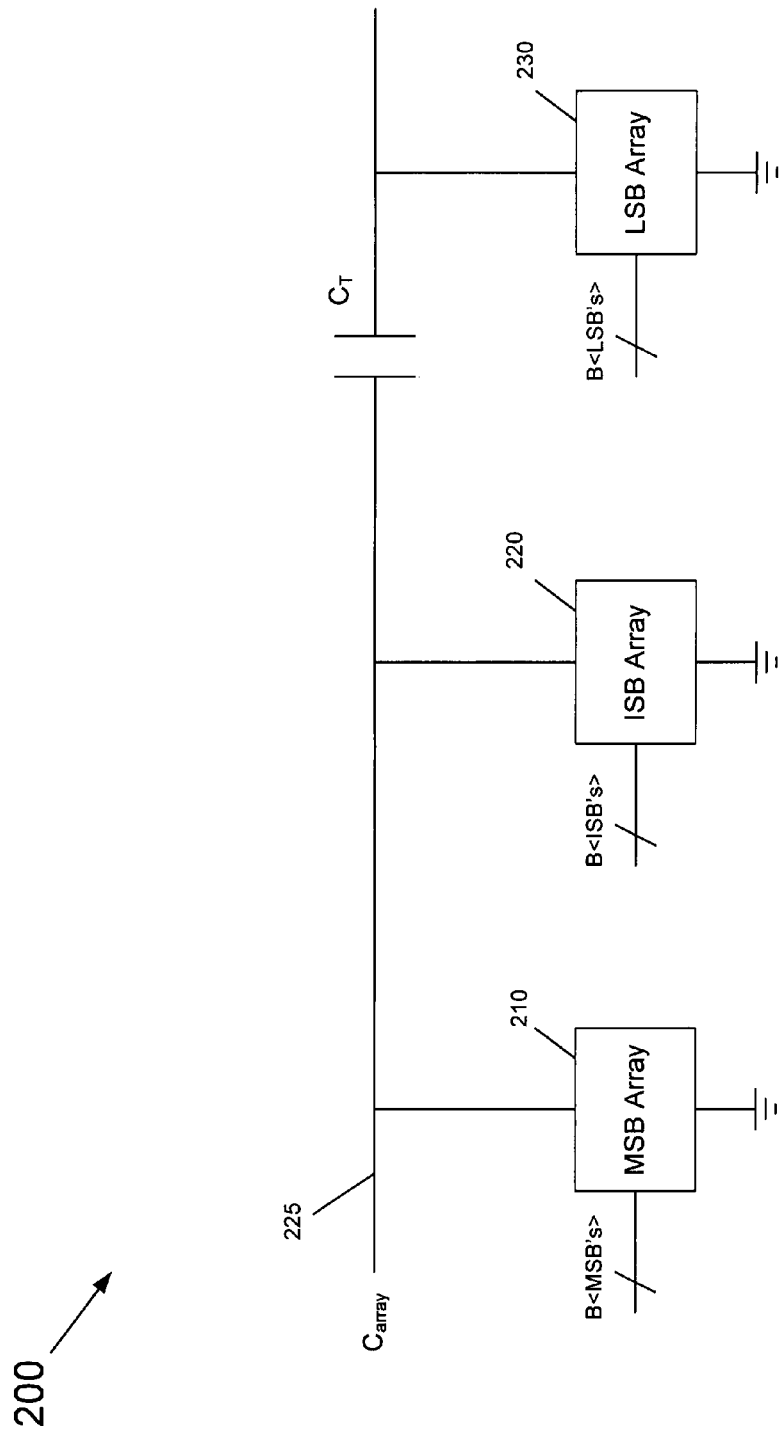
FIG. 5A is a more detailed block diagram of a capacitor bank in accordance with an embodiment of the present invention.

Referring now to FIG. 5A, shown is a block diagram of a capacitor bank in accordance with one embodiment. As shown in FIG. 5A, the capacitor bank 200 includes a plurality of different array portions. Specifically shown in the embodiment of FIG. 5A is a most significant bit (MSB) array 210, an intermediate significant bit (ISB) array 220, and a least significant bit (LSB) array 230. While shown with these three particular arrays in the embodiment of FIG. 5A, in other embodiments more or fewer such arrays may be present. Each array portion may be controlled by a selected number of bits of a digital control word, e.g., digital control frequency signal 71. Specifically, the MSB array 210 may be controlled by a number of the MSB's of the control word (e.g., B<MSB's>), ISB array 220 may be controlled by a number of ISB's (e.g., B<ISB's>), and the LSB array 230 may be controlled by a number of LSB's (e.g., B<LSB's>). Each array portion may be coupled between the capacitor array line 225 and a ground potential.

As further shown in FIG. 5A, a series tuning capacitance, $C_T$, may be coupled in series between the LSB array 230 and the remaining array portions. This series capacitance may be used to control the full-scale value of the LSB array 230 to be finely scaled to the correct capacitance value, allowing for monotonic transitions between the LSB array 230 and the other arrays.

In different embodiments, each of the capacitor array portions may be controlled in different manners to attain a desired capacitance level. For example, the MSB array 210 may be controlled according to a first thermometer-encoded manner, while the ISB array 220 may be controlled according to a second thermometer-encoded manner. Finally, the LSB array portion 230 may be controlled according to a binary-weighted manner. In other words, the LSB array 230 may be implemented using exponentially-related capacitor sizes to achieve power-of-two fixed frequency jumps for each control bit. Of course other control schemes are possible in different embodiments. For example, other implementations, such as radix-controlled banks may also be used. Furthermore, while not shown in FIG. 5A, it is to be understood that selection circuitry to implement the desired decoding may be associated with each of the array portions. The multiple banks may be designed in completely different ways in some implementations, with considerable savings in hardware.

While described in the embodiment of FIG. 5A as including single arrays 210, 220 and 230, it is to be understood that in various embodiments an arbitrary number of sections may be present, each including an arbitrary number of arrays for each of the sections. Furthermore, each array in each section may have an arbitrary bit coding strategy. Furthermore, passive networks may be coupled in series on a capacitor array line between each of the sections.

Figure 5B:
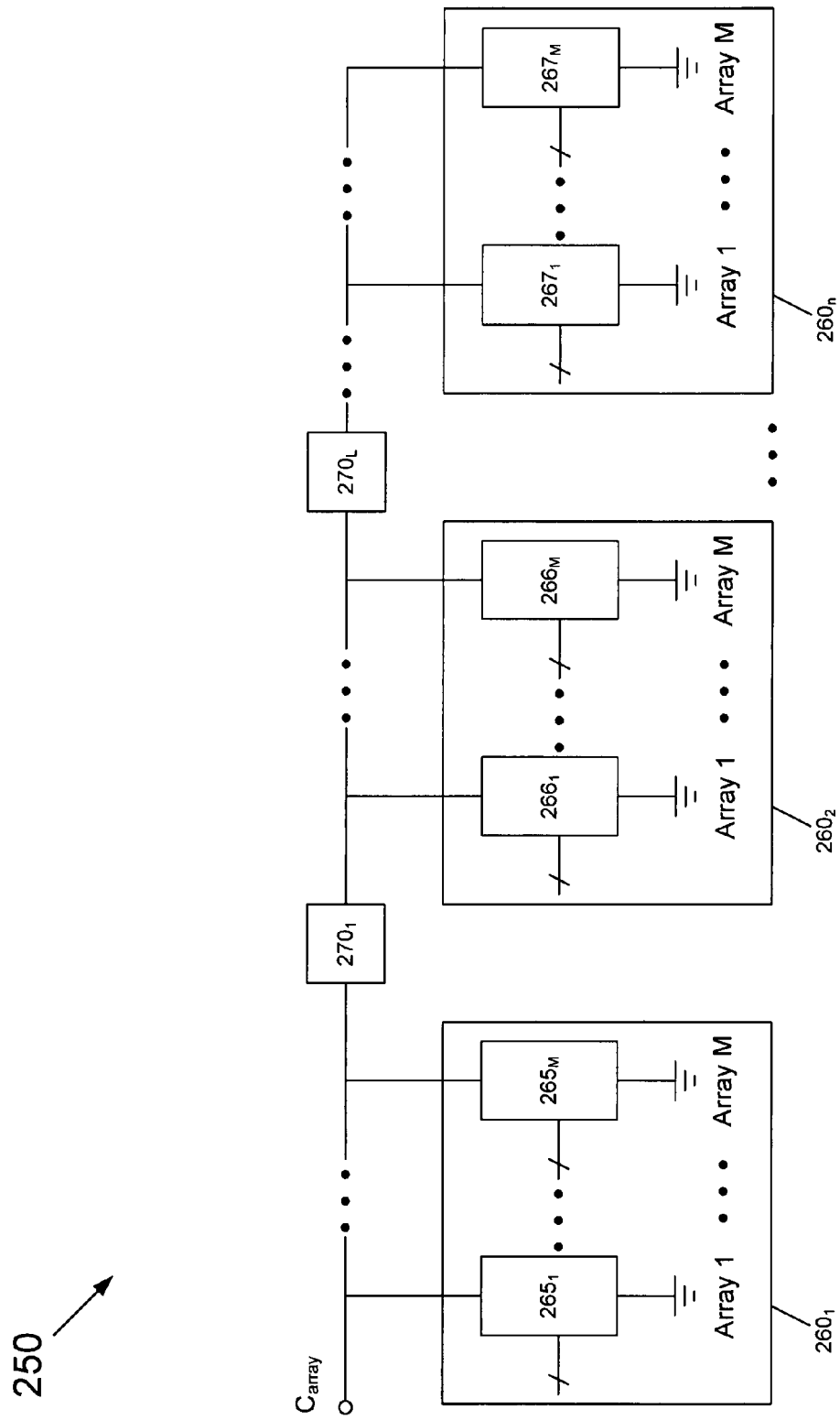
FIG. 5B is another more detailed block diagram of a capacitor bank in accordance with another embodiment of the present invention.

Referring now to FIG. 5B, shown is a block diagram of a generic capacitor array in accordance with one embodiment of the present invention. As shown in FIG. 5B, capacitor array 250 is formed of a plurality of arbitrary sections $260_1$-$260_n$. Each of these sections may include one or more arrays. Shown in the embodiment of FIG. 5B, each section includes an arbitrary number of arrays $265_1$-$265_m$; $266_1$-$266_m$; and $267_1$-$267_m$. Furthermore, each array within a section may be implemented using arbitrary bit coding strategies. As further shown in FIG. 5B, a plurality of passive networks may be coupled in series between different array sections. For instance, as shown in FIG. 5B, a first passive network $270_1$ is coupled between the array section $260_1$ and the array section $260_2$. Each of these passive networks may include one or more components, such as capacitors or other passive elements. As described above, these passive networks may be used to provide an impedance scaling function from section to section.

In some embodiments, individual capacitors that form the different array portions may all be of substantially the same size. That is, the array portions may include different numbers of capacitors having substantially the same value to effect the corresponding weighting for the array portion. In one embodiment, each unit capacitance may be implemented using a metal-to-metal finger-type capacitor. In this embodiment, the approximate unit capacitance of each of these finger capacitors may be approximately 20 femtoFarads (fF), although the scope of the present invention is not so limited. In other embodiments, metal-insulator-metal (MIM) planar type capacitors, p-n semiconductor junction capacitors, metal-oxide semiconductor (MOS) capacitors or other such structures may be used.

Figure 6:
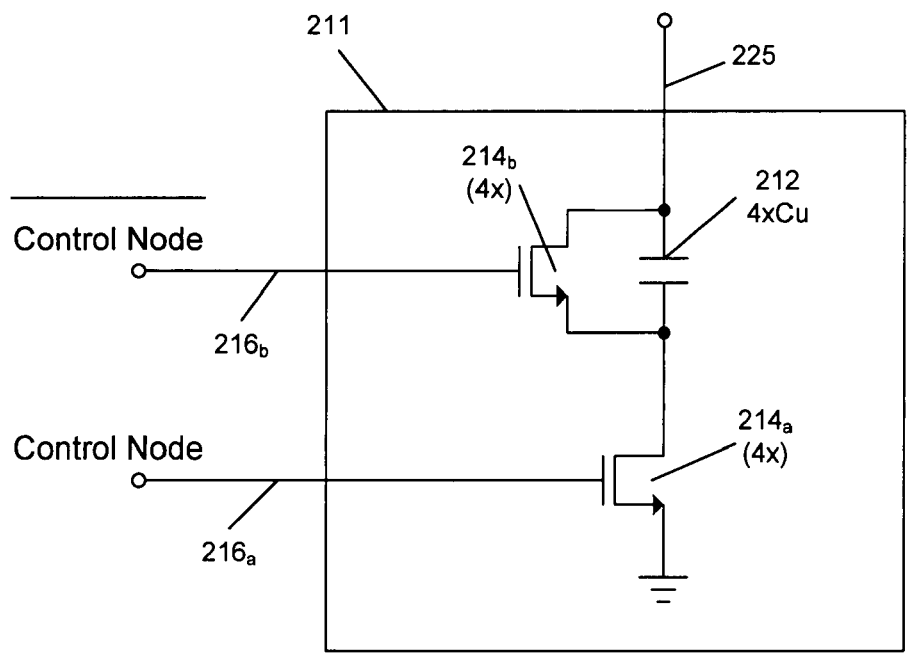
FIG. 6 is a schematic diagram of a capacitor array element in accordance with one embodiment of the present invention.

Referring now to FIG. 6, shown is a schematic diagram of a portion of an MSB array that is controlled by a single control bit. As shown in FIG. 6, an MSB array element 211 includes a plurality of unit capacitances. In the embodiment shown in FIG. 6, a four-unit capacitance ($4C_u$) 212 is coupled between the capacitor array line 225 and a switching device 214a (i.e., a four-unit switching device), which in turn is controlled by a control node 216a. Furthermore, a shunting device 214b is coupled in parallel with capacitance 212 and is controlled by a complementary control node value ($\overline{\text{controlnode}}$) 216b. Thus a single MSB bit and its complementary bit of the digital control word are coupled to four such switching and shunting devices 214a and 214b to selectively couple or shunt the four unit-capacitance which may be associated parallel capacitors, into or out of the array line 225. As shown in the embodiment of FIG. 6, the switching and shunting devices 214 (generally) are n-channel metal-oxide semiconductor field effect transistors (nMOSFETs), although other implementations are possible. The drain terminal of nMOSFET 214a is coupled to one terminal of an associated capacitor 212. The source terminal of the nMOSFET 214a is coupled to ground; and the gate terminal of the nMOSFET 214a receives a binary selection signal via the control node 216a from, e.g., selection circuitry (not shown in FIG. 6). In turn, the drain terminal of the nMOSFET 214b is coupled to the other terminal of the associated capacitor 212 and the capacitor array line 225. The source terminal of the nMOSFET 214b is coupled to the drain terminal of the nMOSFET 214a and the other terminal of the associated capacitor 212; and the gate terminal of the nMOSFET 214b receives the opposite binary selection signal via the control node 216b. Thus, the activation (via its gate terminal) of a particular nMOSFET 214a and the de-activation of the corresponding nMOSFET 214b connects the associated capacitor 212 to ground and thus, adds capacitance to the line 225. This additional capacitance, in turn, changes the oscillation frequency. Likewise, the de-activation (turning off, for example) of a particular nMOSFET 214 (via its gate terminal) and the corresponding activation of the corresponding nMOSFET 214b removes capacitance from the line 225 and thus, affects the oscillation frequency in the opposite direction.

In one embodiment, the MSB array 210 (of FIG. 5A) may have a plurality of array elements controlled by six bits of a digital control word. In a GSM implementation, for example, bits 7-12 of a control word may control the MSB array 210. As discussed above, in one embodiment these bits may be thermometer decoded to control the MSB array 210.

Figure 7:
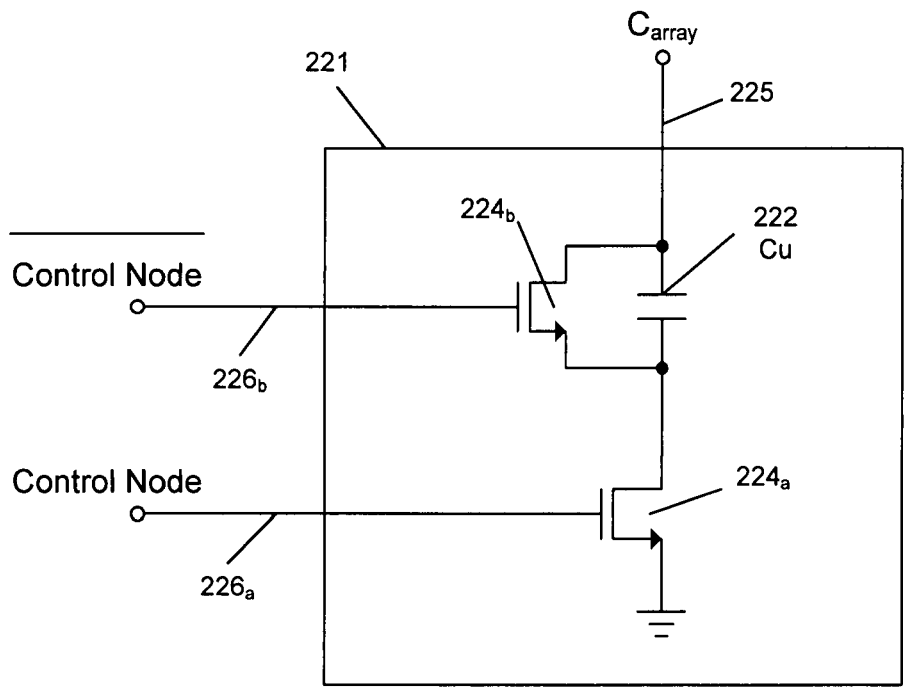
FIG. 7 is a schematic diagram of a capacitor array element in another embodiment of the present invention.

Referring now to FIG. 7, shown is a schematic diagram of a portion of an ISB array that is controlled by a single control bit. As shown in FIG. 7, an ISB array element 221 includes a single unit capacitance ($C_u$) 222 coupled between the capacitor array line 225 and a switching device 224a, which in turn is controlled by a control node 226a. Similarly, a shunting device 224b is coupled in parallel with capacitance 222 and is controlled by a corresponding complementary control node 226b. In the embodiment of FIG. 7, the switching and shunting devices (generally) 224 may be nMOSFETs, although other variations are possible. Note that the MSB array element 211 shown in FIG. 6 may be formed of four of the ISB array elements 221.

In one implementation, the ISB array 220 (of FIG. 5A) may be controlled by two intermediate significant bits of a digital control word. For example, continuing with the embodiment discussed above in FIG. 6, bits 5 and 6 of the control word may be used to control the ISB array 220.

Figure 8A:
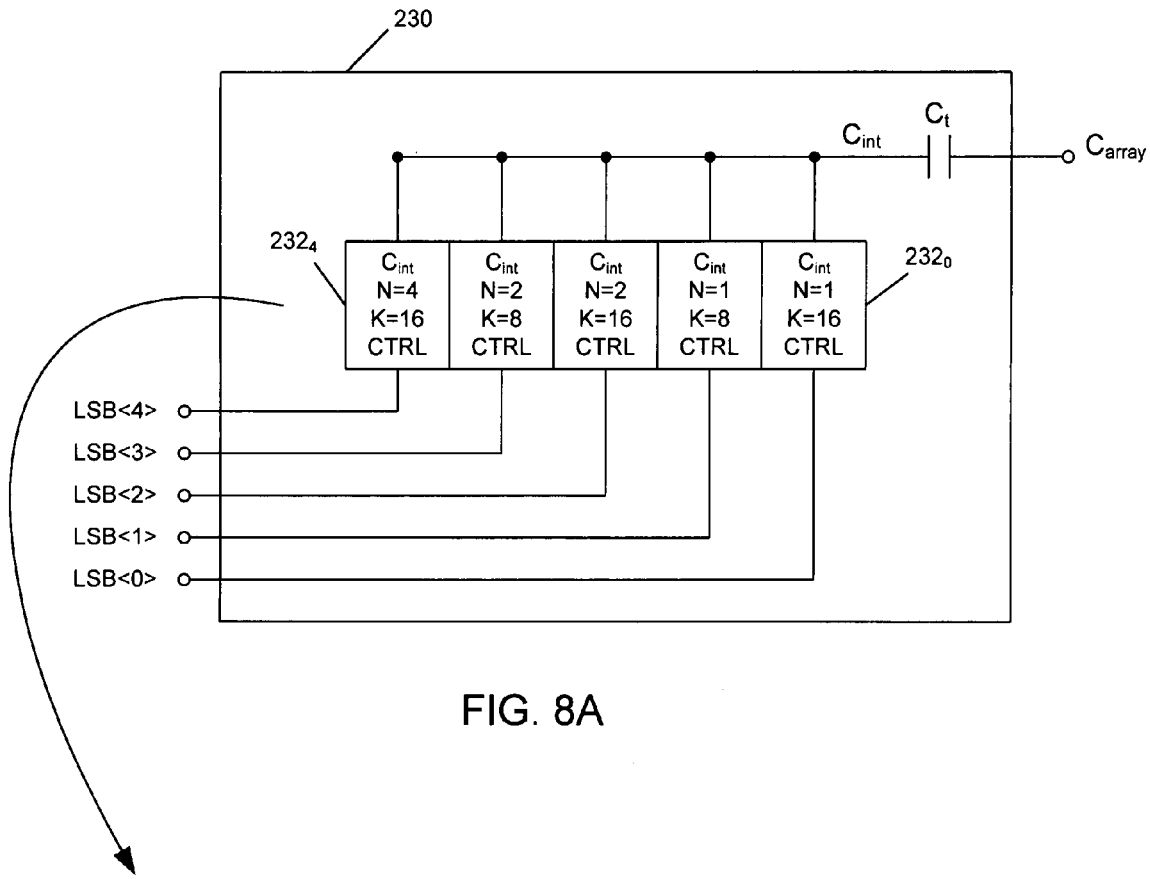
FIG. 8A is a block diagram of a capacitor array section in one embodiment of the present invention.

Referring now to FIG. 8A, shown is a block diagram of a LSB array portion in accordance with one embodiment of the present invention. Furthermore, FIG. 8A shows connection of the LSB array 230 to other arrays of a DCCA (not shown in FIG. 8A) via a tuning capacitance, $C_T$. As shown in FIG. 8A, the LSB array 230 may include a plurality of capacitance elements $232_0$-$232_4$, each controlled by a bit of a digital control word, e.g., the five LSB's of the digital control word. Continuing with the GSM embodiment, the five LSB's of a digital control word (shown as LSB<0-4> in FIG. 8A) are each coupled to one or more respective capacitance elements $232_0$-$232_4$ (generically capacitance element 232).

Figure 8B:
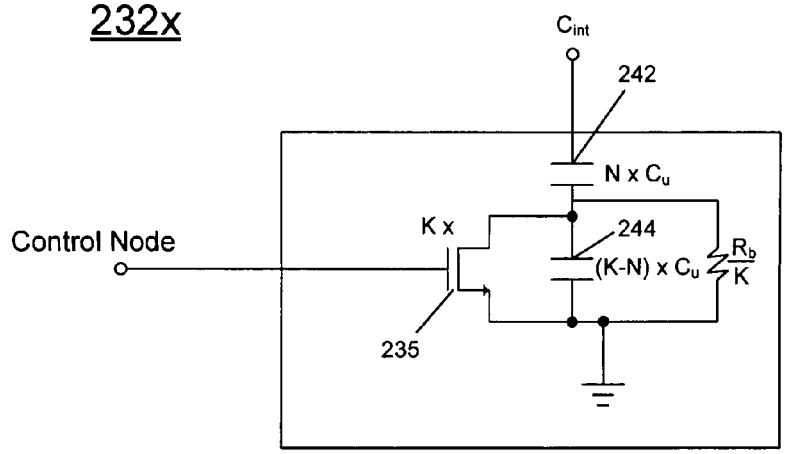
FIG. 8B is a schematic diagram of a capacitor array element in another embodiment of the present invention.

Referring now to FIG. 8B, shown is a schematic diagram of an example capacitive element. As shown in FIG. 8B, each capacitance element 232 may be formed using an N/K capacitance scheme. As shown in FIG. 8B, this scheme may include a first capacitance ($N*C_u$) 242 coupled between an intermediate node ($C_{int}$) and a second capacitance ($(K-N)*C_u$) 244 in turn coupled to ground. As further shown in FIG. 8B, a passive element, namely a bias resistance $R_b/K$, is coupled in parallel to the second capacitance 244, as is a switching device 235, which is coupled to receive a respective bit via a control node. As shown in FIG. 8A, each capacitance element 232 may have a different weighting based on the different values of N and K shown in FIG. 8A. In this embodiment, the values of N and K shown in FIG. 8A implement a binary-weighted LSB array, in which the effective switched capacitance of capacitance elements $232_0$-$232_4$ may range as shown in FIG. 8A. Due to the binary weighting, the more significant bits of the LSBs control the coupling of the more significant capacitance to the line 225. In other embodiments, other weighting can be used such as radix weightings to attain overlapping capacitive ranges. Furthermore, the switching devices 235 may not be of the same size, as they may be binarily weighted, in some embodiments of the invention.

The N/K implementation may provide for further fine tuning of capacitance values, another capacitance may be coupled into each capacitor branch in parallel between the associated switching device and ground. The second capacitance 244 may have a value substantially greater than the capacitor 242. Accordingly, when the associated switching device 235 is enabled, a capacitance corresponding to the branch capacitor 242 is switched into the capacitor array line 225. When the switching device 235 is disabled, however, an effective capacitance of $$\frac{C_{242} C_{244}}{C_{242} + C_{244}}$$

is switched into the capacitor array line 225. However, in other embodiments a pure binary-weighted array may be used without these additional shunt capacitances. In one embodiment, the bias resistance, $R_b$ may have a value of three MΩ and $C_u$ may correspond to 20 fF, although the scope of the present invention is not so limited.

To enable monotonic frequency changes by digitally controlling a DCCA, a tuning capacitance is coupled in series between the LSB array 230 and remaining arrays coupled to the capacitor array line 225. This tuning capacitance allows for monotonic transitions between the LSB array 230 and the intermediate array 220, for example. As an example, assume that a digital control word having its five LSBs at a value of 1 and its sixth bit at a value of 0 transitions to a state in which the sixth bit is set to a value of 1 and the five LSBs are set to 0. To maintain a monotonic transition upon this occurrence, the tuning capacitance can be appropriately adjusted to correctly weight the LSB array.

Different manners of implementing a tuning capacitance may be provided in different embodiments. In one embodiment, a fixed tuning capacitance determined during design may be implemented. For example, while different implementations are possible, in one embodiment a calibration procedure may be performed to account for the differences between the banks. In general, the calibration may be used to determine how many fine bits are in a coarse LSB at the time of calibration (e.g., during operation at given temperature and voltage levels for a particular device's manufacturing process variation). In a fixed tuning scheme, a linear approximation may be performed between different values for $C_T$ to arrive at an appropriate value for a design. This amount of capacitance may be added in series between the LSB array 230 and the other arrays. In one embodiment, the fixed tuning capacitance may correspond to 24 times a unit capacitance value. Thus, using a fixed capacitance, tuning of the LSB array portion 230 may be performed in production by determining the optimum tuning code for $C_T$.

In other embodiments, an adjustable tuning capacitance, or a combination of a fixed tuning capacitance and an adjustable tuning capacitance may be implemented. For example, instead of a fixed capacitance, an adjustable capacitance, such as thermometer-encoded or exponentially-weighted capacitors may be provided as the tuning capacitance. By using an adjustable capacitance, the LSB array portion 230 may be digitally tuned. That is, an additional digital control word may be provided to multiple switching devices that control switching or coupling of the adjustable capacitances into or out of the capacitor array line to provide the tuning capacitance. In one implementation, a fixed tuning capacitance may be coupled between node $C_{int}$ (shown in FIG. 8A) and a ground potential. In yet other implementations, an adjustable capacitance may be provided in addition to the fixed tuning capacitance. In such an implementation, the fixed capacitance $C_T$ is coupled as shown in FIG. 8A and an adjustable capacitance coupled between node $C_{int}$ and a ground potential may provide for an electronic means of weighting the LSB array. Still further, other passive elements, such as resistances may be used to provide tuning.

Figure 9:
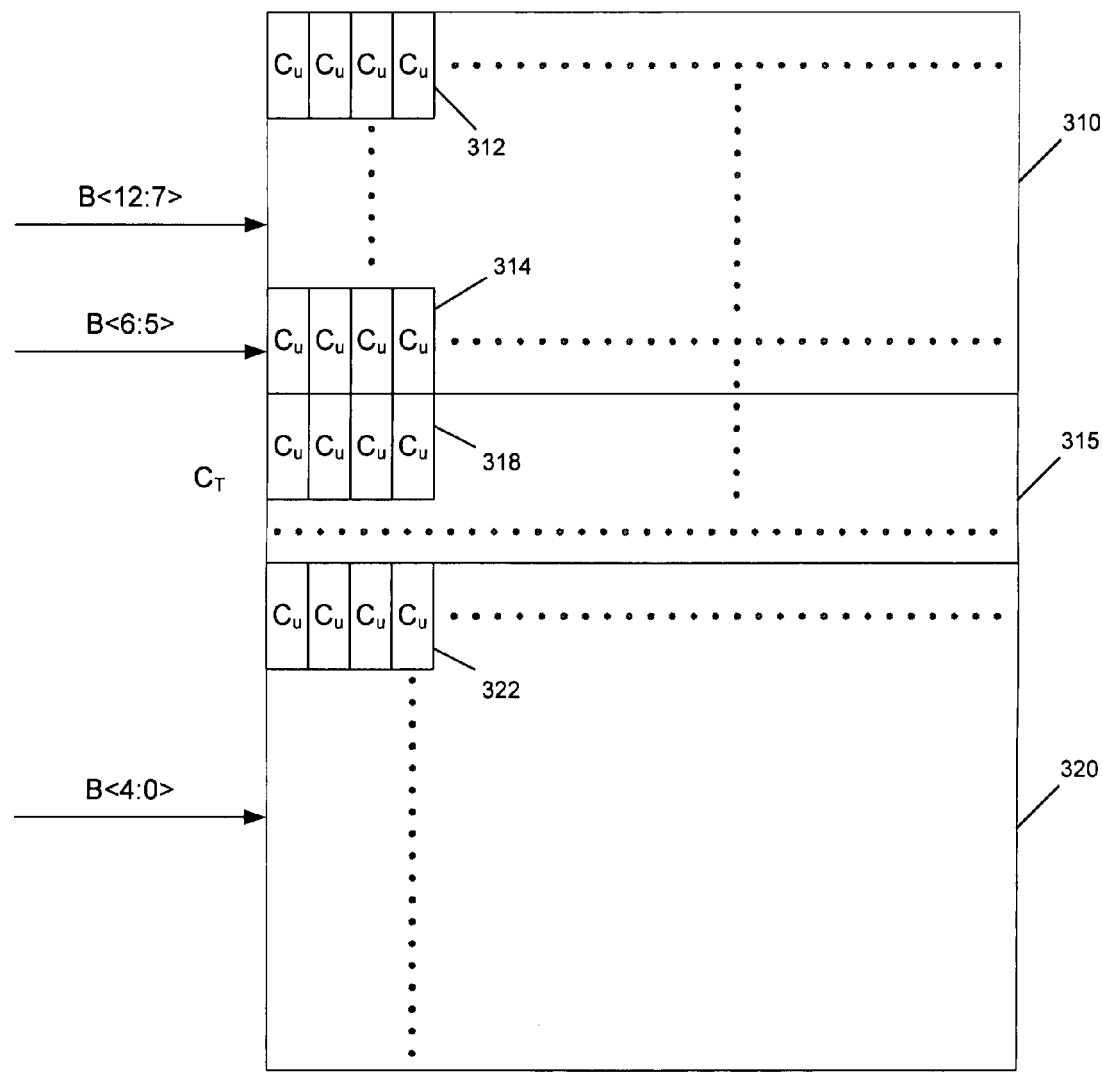
FIG. 9 is a block diagram of a capacitor array layout in accordance with one embodiment of the present invention.

In some embodiments, a capacitor array in accordance with an embodiment of the present invention may be formed in a two-dimensional array on a single substrate. For example, the array may be formed on a substrate that also includes the transceiver 32 of FIG. 2 and other associated circuitry. Referring now to FIG. 9, shown is a block diagram of a layout of a capacitor array in accordance with one embodiment of the present invention. As shown in FIG. 9, a capacitor array 300 includes a higher array 310, a tuning array 315, and a lower array 320. In one implementation, the higher array 310 may include capacitors corresponding to the MSB array 210 and the ISB array 220 of FIG. 5. Furthermore, the tuning array 315 may correspond to $C_T$, shown in FIG. 5 and also shown in FIG. 8A. Finally, the lower array 320 may correspond to the LSB array 230 of FIG. 5.

The upper array 310 may be an 8×8 array, in which each array element includes four unit capacitances, $C_u$, in one embodiment. Sixty three of these array elements 312 may be controlled by the most significant six bits of a digital control word (e.g., bits <12:7>) in a thermometer-coded fashion. The last array element 314 may be controlled by the two intermediate significant bits of the digital control word (e.g., bits <6:5>) and may thus correspond to the ISB array 220, also in a thermometer-coded fashion. Note that because in at least certain implementations, the MSB array portion may be of a different thermometer coded weighting than the intermediate array portion, the LSB of the MSBs (e.g., bit <7>) may control an entire array element 312 (e.g., four unit capacitances, $C_u$). In contrast, the LSB of the intermediate bits (e.g., bit <5>) may control only a single unit capacitance of the array element 314 (e.g., one $C_u$). Of course other variations are possible.

Still referring to FIG. 9, the tuning portion 315 may include a plurality of array elements, each also including four unit capacitances $C_u$. As described above, the tuning portion 315 may be controlled in different manners. For example, a fixed tuning capacitance may be enabled by hard wiring a certain number of the unit capacitances onto a capacitor array line. To provide for acceptable tuning over operating variations, at least a suitable percentage of the tuning portion 315 may be hardwired into the capacitor array line. For example, assuming that the tuning portion 315 is formed of a 2×8 array of array elements 318, between approximately 40% to 60% of the array elements 318 may be coupled onto the capacitor array line. Alternately, the tuning portion 315 may be adjustable using thermometer decoding or other desired decoding.

Finally, the lower array 320 may correspond to the LSB array portion 230 of FIG. 5 and may include a plurality of array elements 322. In one implementation, the lower array 320 may be a 8×8 array, although the scope of the present invention is not so limited. For example, in an implementation in which an N/K scheme is provided for each branch of the LSB array, (e.g., as shown in the schematic diagram of FIG. 8B) the lower array 320 may also be an 8×8 array in which one or two rows may be associated with each bit value. In one embodiment, the lower array 320 may be controlled by the LSBs of a digital control word, e.g., the five LSBs. In this implementation, the five LSBs may use a binary-weighted decoding to control the selected capacitances.

Using the array layout shown in FIG. 9, routing of control signals may be significantly reduced, reducing array size and complexity. Furthermore, by using substantially identical capacitor values, tolerances may be tightly controlled. In various embodiments, the array 300 may be formed as a single structure occupying one portion of the substrate. In this manner, because the array 300 is formed of substantially identical unit capacitances located on the same portion of the substrate, the capacitances will scale virtually identically at different process, voltage, and temperature (PVT) parameters. Accordingly, tightly controlled capacitances may be effected.

Via use of the series capacitive coupling of the LSB array portion to higher array portions, seamless frequency control may be effected, even when switching between the different capacitor array portions, such that capacitance values can be smoothly controlled. In some embodiments, capacitance values may be controlled to a value less than a half step of the LSB value. Accordingly, when a step change occurs and the LSB array 230 is switched from a full scale state to a completely off state (for example), a capacitance change less than a half step of the LSB of the LSB array portion may be realized, allowing fine monotonic frequency changes in the associated oscillator.

Figure 10:
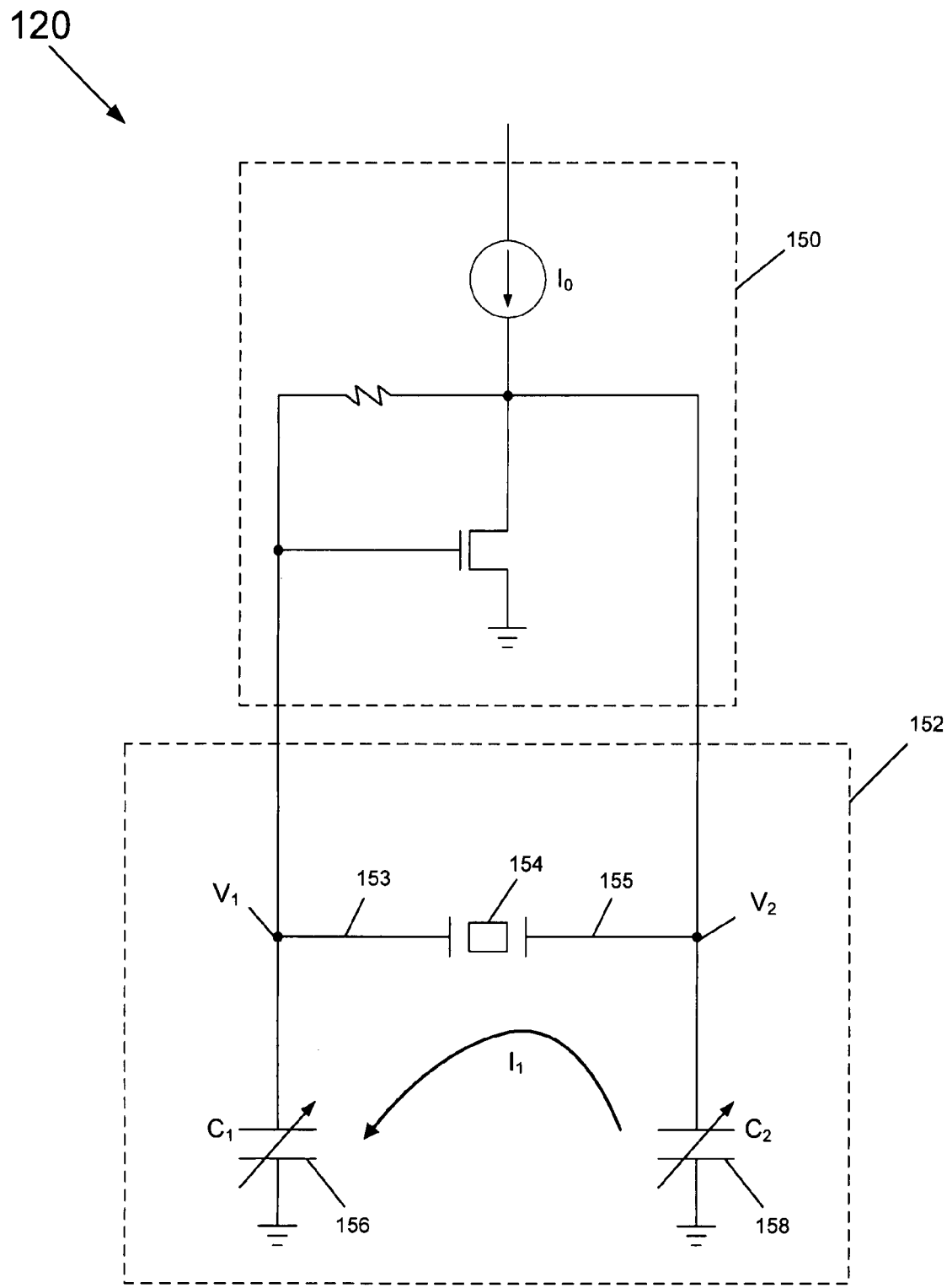
FIG. 10 is a schematic diagram of an oscillator core in accordance with one embodiment of the present invention.

In some embodiments of the invention, an oscillator core may have a Colpitts oscillator topology, as depicted in FIG. 10. In these embodiments of the invention, the oscillator core 120 may include an amplifier 150 that is coupled between nodes called V1 (providing a V1 voltage) and V2 (providing a V2 voltage). The nodes V1 and V2, in turn, are nodes of a resonant tank 152 of the oscillator 120. The basic Colpitts configuration includes a capacitor 156 that is coupled between the node V1 and ground and another capacitor 158 that is coupled between the node V2 and ground.

As depicted in FIG. 10, in some embodiments of the invention, the capacitors 156 and 158 may both be variable capacitors and have capacitances C1 and C2, respectively. The C1 and C2 capacitances, in turn, represent the capacitance that may be selectively coupled to the resonant tank 152 in response to the frequency control signal 71. Thus, in some embodiments of the invention, the oscillator 72 may include more than one capacitance array line 225 and may, in turn, include mirrored capacitor banks, one of which is coupled to the node V1 and the other of which is coupled to the node V2. In these embodiments of the invention, changes to the capacitance C1 may occur concurrently with changes to the capacitance C2.

As depicted in FIG. 10, the resonant tank 152 includes a crystal 154 (also called a "crystal resonator") that is coupled between the nodes V1 and V2. As shown in FIG. 10, a current I1 flows in a path containing the capacitors 156 and 158 and the crystal 154. An insignificant level of current flows into or out of the amplifier 150, as compared to the current I1. Thus, for simplification, it is assumed that no current from the resonant tank 152 flows into or out of the amplifier 150. As depicted in FIG. 10, in some embodiments of the invention, the amplifier 150 may be an NMOS amplifier that is formed from a current source and an nMOSFET transistor. Other types of amplifiers are possible in other embodiments of the invention. Furthermore, in other embodiments of the invention, oscillator topologies other than a Colpitts topology may be used.

For purposes of extracting the sinusoidal reference signal from the resonant tank 152, the signal may be taken either from the node V1 voltage, the V2 voltage or some combination of these voltages. In some embodiments of the invention, the node V1 may be chosen to provide the sinusoidal reference signal and is thus coupled to the output line 73, shown in FIG. 4.

In some embodiments of the invention, the capacitance changes may be controlled in software. In this manner, in some embodiments of the invention, the baseband subsystem 58 may include memory and a processor that is coupled to the memory. The memory may store instructions that when executed by the processor causes the processor to communicate frequency changes to the transceiver 32 in accordance with a technique 500 that is depicted in FIG. 11.

Figure 11:
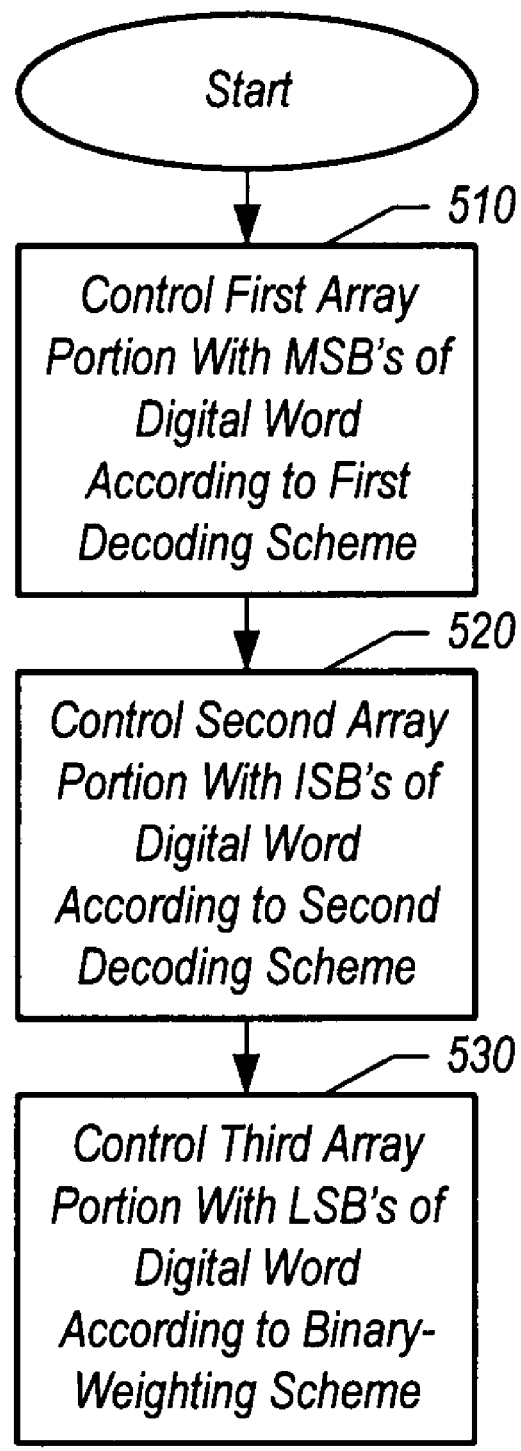
FIG. 11 is a flow diagram of a method in accordance with one embodiment of the present invention.

Referring now to FIG. 11, shown is a flow diagram of a method in accordance with one embodiment of the present invention. As shown in FIG. 11, method 500 may be used to control an amount of capacitance to be coupled to a capacitor array line. In various embodiments, method 500 may be implemented in hardware, firmware or software. As shown in FIG. 11, method 500 may begin by controlling a first array portion with the MSBs of a digital word (block 510). The control of this first array portion may be according to a first decoding scheme, e.g., a thermometer decoding scheme. Next, a second array portion may be controlled with intermediate bits of the digital word (block 520). As an example, the second array portion may be controlled according to a second decoding scheme, which may be a differently weighted thermometer decoding scheme, for example. Finally, with reference to FIG. 11, a third array portion may be controlled with the LSBs of the digital word (block 530). In the embodiment of FIG. 11, the third array portion may be controlled according to a binary-weighted scheme. In many implementations, each of blocks 510, 520 and 530 may be performed simultaneously. While shown with this implementation in the embodiment of FIG. 11, it is to be understood that different control schemes are possible in different embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
 a capacitor array to couple a selected capacitance to a common capacitor array output node, the capacitor array including:
  a first section including at least one first array portion to receive a first significant portion of a digital control value, the first section having a first coding scheme; and
  a second section including at least one second array portion to receive a second significant portion of the digital control value, the second section having a second coding scheme.

2. The apparatus of claim 1, further comprising a third section including at least one third array portion to receive a third significant portion of the digital control value, the third section having a third coding scheme.

3. The apparatus of claim 1, wherein the common capacitor array output node is coupled to an oscillator.

4. The apparatus of claim 3, wherein the oscillator comprises a digitally controlled crystal oscillator (DCXO).

5. The apparatus of claim 2, further comprising a passive network coupled in series between the first section and the second section.

6. The apparatus of claim 5, wherein the passive network comprises a tuning capacitance formed of an adjustable capacitance.

7. The apparatus of claim 5, wherein the passive network comprises a fixed capacitance and an adjustable capacitance or resistance.

8. The apparatus of claim 2, wherein the capacitor array is to provide a monotonic response to a monotonic change in the digital control value.

9. The apparatus of claim 1, wherein each bit of the first significant portion of the digital control value is to control a plurality of unit capacitances of one or more array elements of the at least one first array portion.

10. The apparatus of claim 9, wherein each bit of the second significant portion of the digital control value is to control a single unit capacitance of an array element of the at least one second array portion.

11. The apparatus of claim 2, wherein at least one branch of the at least one third array portion comprises a first capacitance coupled between a third array line and a switching device and a second capacitance coupled in parallel between the switching device and a reference potential, the second capacitance to be coupled to the third array line under control of the switching device.

12. A method comprising:
controlling a first portion of a capacitor array according to a first decoding scheme via a most significant segment of a control word;
controlling a second portion of the capacitor array according to a second decoding scheme via an intermediate segment of the control word; and
controlling a third portion of the capacitor array according to a weighting scheme via a least significant segment of the control word.

13. The method of claim 12, further comprising capacitively coupling the third portion of the capacitor array onto an array line.

14. The method of claim 13, further comprising tuning the third portion to at least the second portion via the capacitive coupling.

15. The method of claim 13, further comprising adjusting the capacitive coupling according to a second control word.

16. A digitally controlled capacitor array comprising:
a first array bank having a plurality of first array elements, each of the first array elements including a plurality of first unit capacitances of substantially equal value, wherein a first portion of the first array elements are digitally controlled according to a first coding scheme by a first plurality of bits, wherein a least significant bit of the first plurality of bits is to control the plurality of first unit capacitances of at least one first array element, and a second portion of the first array elements are digitally controlled according to a second coding scheme by a second plurality of bits, wherein a least significant bit of the second plurality of bits is to control a single first unit capacitance of a single first array element.

17. The digitally controlled capacitor array of claim 16, further comprising a second array bank having a plurality of second array elements.

18. The digitally controlled capacitor array of claim 17, further comprising a third array bank having a plurality of third array elements.

19. The digitally controlled capacitor array of claim 18, wherein the second array bank is to adjust a weighting of the third array bank to the first array bank to enable a monotonic step between the third array bank and the first array bank.

20. The digitally controlled capacitor array of claim 17, wherein at least a portion of the plurality of second array elements are hardwired onto a capacitor array line coupled to the digitally controlled capacitor array.

21. The digitally controlled capacitor array of claim 16, wherein the first unit capacitances comprise finger capacitors.

22. The digitally controlled capacitor array of claim 16, further comprising a capacitor array line to couple the first array bank to a digitally controlled crystal oscillator (DCXO) of a mobile station transceiver, wherein the first array bank, the DCXO, and the mobile station transceiver are integrated on a single substrate.

23. A system comprising:
a baseband processor; and
a transceiver coupled to receive digital control information from the baseband processor, the transceiver including:
a digitally controlled crystal oscillator (DCXO) to generate a reference signal; and
a digitally controlled capacitor array (DCCA) including a plurality of array portions each coupled to a capacitor array line coupled to the DCXO, each of the plurality of array portions to receive a predetermined portion of a digital control value, each of the array portions having a different coding scheme, and the DCCA further including a tuning array portion to adjust a weighting of at least one of the plurality of array portions.

24. The system of claim 23, wherein each bit of a most significant portion of the digital control value is to control one or more array elements, each of the array elements including a plurality of equally sized capacitors.

25. The system of claim 24, wherein an intermediate portion of the digital control value is to control a single array element including the plurality of equally sized capacitors.

26. The system of claim 23, wherein the tuning array portion is to capacitively couple the array portion that is to receive a least significant portion of the digital control value to the capacitor array line.

* * * * *